United States Patent
Wu et al.

(10) Patent No.: US 6,392,946 B1
(45) Date of Patent: May 21, 2002

(54) SDR AND QDR CONVERTER AND INTERFACE CARD, MOTHERBOARD AND MEMORY MODULE INTERFACE USING THE SAME

(75) Inventors: Kun Ho Wu, Feng-Shan; Hai Feng Chuang, Tainan, both of (TW)

(73) Assignee: Leadtek Research Inc., Taipei Hsien (TW)

( * ) Notice: Subject to any disclaimer, the term of this patent is extended or adjusted under 35 U.S.C. 154(b) by 0 days.

(21) Appl. No.: 09/930,746

(22) Filed: Aug. 14, 2001

Related U.S. Application Data

(60) Provisional application No. 60/291,377, filed on May 15, 2001.

(51) Int. Cl.[7] .............................................. G11C 7/00
(52) U.S. Cl. ................... 365/219; 365/189.02; 365/233
(58) Field of Search ......................... 365/233, 189.02, 365/230.02, 219

(56) References Cited

U.S. PATENT DOCUMENTS

| | | | | | |
|---|---|---|---|---|---|
| 6,061,292 A | * | 5/2000 | Su et al. | ................ | 365/189.05 |
| 6,157,560 A | * | 12/2000 | Zheng | ................ | 365/230.02 |
| 6,275,441 B1 | * | 8/2001 | Oh | ................ | 365/233 |

* cited by examiner

*Primary Examiner*—Son Mai
(74) *Attorney, Agent, or Firm*—J.C. Patents

(57) ABSTRACT

A SDR and QDR converter and an interface, a motherboard and a memory module interface using the same. The converter of SDR and QDR has a QDR interface, a SDR interface and a conversion core. The QDR interface is used to exchange a signal with QDR devices. The SDR interface is used to exchange a signal with SDR devices. The conversion core is used to convert QDR command and data formats into SDR command and data formats, and to convert SDR command and data formats into QDR command and data formats.

10 Claims, 8 Drawing Sheets

SDR AND QDR CONVERTER AND INTERFACE CARD, MOTHERBOARD AND MEMORY MODULE INTERFACE USING THE SAME

CROSS-REFERENCE TO RELATED APPLICATION

This application claims the priority benefit of U.S.A. provisional application Ser. No. 60/291,377, filed May 15, 2001.

BACKGROUND OF THE INVENTION

1. Field of Invention

The invention relates a memory converter and the apparatus for applying the same. More particularly, the invention relates to a SDR and QDR converter, and an interface card, a motherboard, a memory module and a portable computer motherboard using the QDR and SRD converter.

2. Related Art

Along with the advancement in techniques for wafer fabrication package process, and in addition to the rapid growth in processing speed of the central processing unit (CPU), various alterations of a computer's memory management have occurred. Demand for access speed has pushed the development of memory from the early dynamic random access memory (DRAM), the extended data output put random access memory (EDO RAM), to the current synchronous data rate RAM (SDR RAM) and double data rate RAM (DDR RAM). Currently, the fabrication cost for DDR RAM's is very high. Therefore, if one can implement SDR RAM to the efficiency of the DDR RAM or an even higher efficiency, fabrication cost will be reduced.

SUMMARY OF THE INVENTION

The present invention provides a method and a structure with a higher access speed to improve the performance of the SDR RAM. The structure is called "quadruple data rate RAM (QDR)". The invention includes the formation of the QDR signal system and the conversion method between the SDR and QDR signal systems. The conversion structure and method provided by the invention can be applied to all the electronic equipment that requires RAM, such as interface cards, motherboards and the portable computer motherboards.

The SDR and QDR converter provided by the invention has a QDR interface, a SDR interface, a clock controller, a command controller, a state register and a data converter. The QDR interface is used to exchange a signal with a QDR device. The SDR interface is used to exchange a signal with a SDR device. The clock controller converts the clock signal sent from the QDR device into a clock used by the converter and the SDR device. After receiving a QDR command signal from the QDR device, the command controller processes the QDR command signal into a corresponding SDR command signal and outputs the SDR command signal into the SDR device. The state register is used to store data of the mode register set (MRS) and the extended mode register set (MRS), and to provide conversion data to the command controller for appropriate command and data conversion. The data converter is used to convert the QDR data format into a SDR data format, and convert the SDR data format into a QDR data format.

In one embodiment of the invention, the data converter comprises a data mask and probe controller, a QDR-to-SDR data converter and an SDR-to-QDR data converter. The data mask and probe controller is used to obtain the QM signal and DQS signal of the QDR device. The QM signal is then converted into a SDR QM signal output to the SDR device, while the DQS signal is converted into a data extract signal for the QDR device to extract data from the SDR device. The QDR-to-SDR data converter converts the serial signal of the QDR device into a parallel signal. At the command of the command controller, a parallel signal is sent to four SDR devices. The SDR-to-QDR data converter converts two data signals of the SDR device into the serial signals used by the QDR device, which are then sent to the QDR device according to the command output from the command controller.

According to the above, a conversion channel is established between QDR and SDR, so that SDR can operate normally in a system or apparatus supporting QDR without converting the system or apparatus into a SDR supporting system or apparatus. The DDR and SDR can thus operate normally simultaneously.

Therefore, the user does not have to buy an additional QDR memory module. The invention uses the existent SDR memory module to upgrade to a memory module with both the SDR and QDR functions.

To the manufacturer, SDR chips with a lower cost can be selected while manufacturing the interface, motherboard and the related printed circuit boards to obtain a product with the QDR data process effect. The quality and performance of the product are enhanced without raising the fabrication cost.

BRIEF DESCRIPTION OF THE DRAWINGS

These, as well as other features of the present invention, will become more apparent upon reference to the drawings, wherein.

DETAILED DESCRIPTION OF THE PREFERRED EMBODIMENTS

Figure 1A:
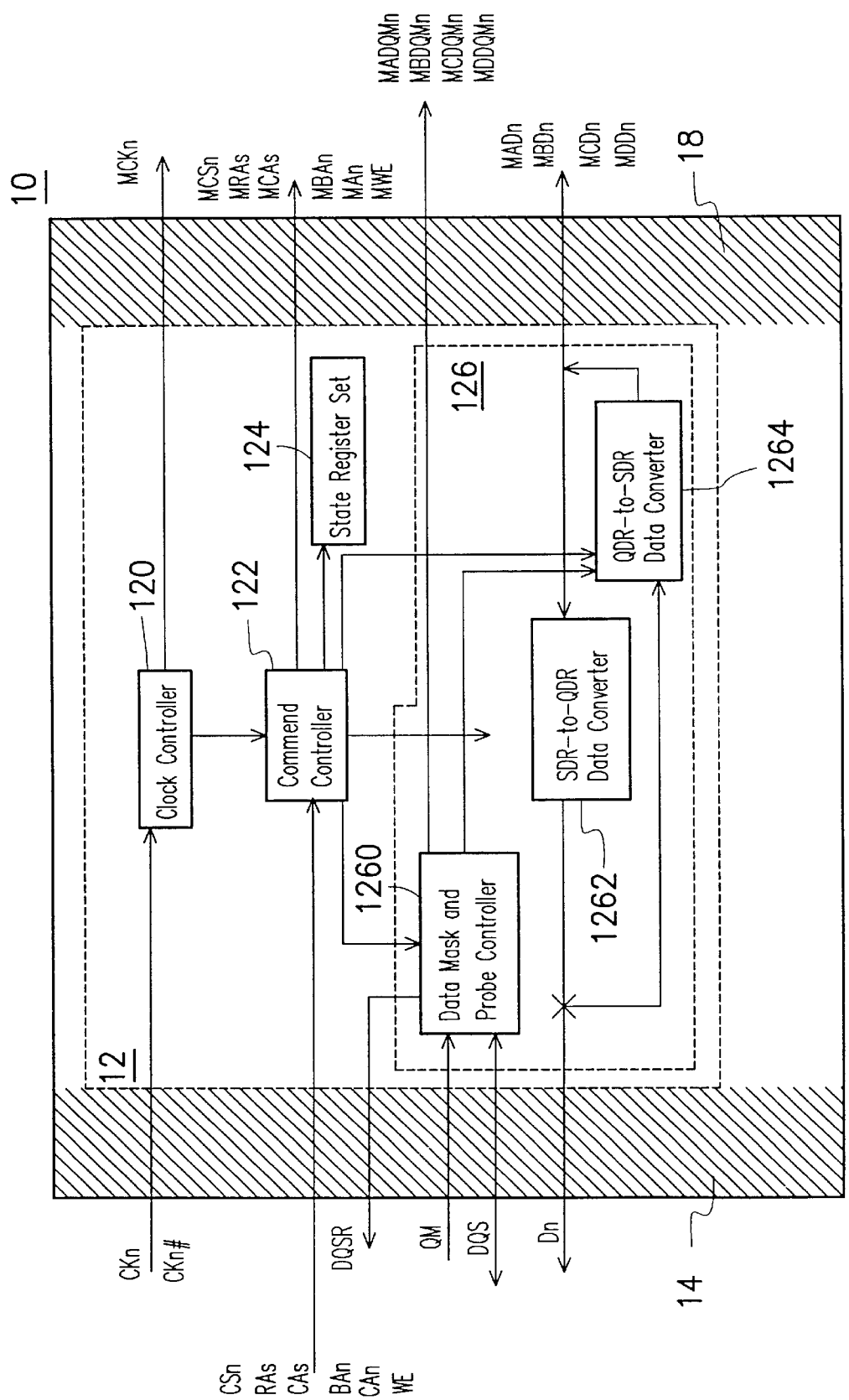
FIG. 1A is a block diagram showing a converter in a first embodiment of the invention.

In FIG. 1A, a block diagram of a converter in a first embodiment of the invention is shown. The SDR and QDR converter 10 has a QDR interface 14, a SDR interface 18 and a conversion core 12. The converter can be termed as "SQDR". The QDR interface 14 is used to perform a signal exchange with the QDR memory module, while the SDR interface 18 is used to perform a signal exchange with the SDR memory module.

In FIG. 1A, a first embodiment of the internal circuit of the conversion core 12 is illustrated. The conversion core 12 comprises a clock controller 120, a command controller 122, a state register set 124 and a data converter 126. The clock controller 120 converts the clock signals (CKn, CKn#) sent from the QDR device into a clock MCKn used by the converter 10 and the SDR device.

After obtaining the QDR command (including CSn, RAs, CAs, BAn, CAn, WE), the command controller 122 processes the QDR command into a corresponding SDR command (MCSn, MRAs, MCAs, MBAn, MAn, MWE) output to the SDR device. When the QDR signal is a data read command or a data write command, the data converter 126 activates the function control mechanism. The state register set 124 is used to store the data in the mode register set MSR and the extended mode register set EMRS used by the QDR interface. The data converter 126 then converts the QDR data format into an appropriate SDR data format, and the SDR data format into an appropriate QDR data format.

In FIG. 1A, the internal circuit of the data converter 126 is illustrated. In this embodiment, the data converter 126 has a data mask and probe controller 1260, an SDR-to-QDR data converter 1262 and a QDR-to-SDR data converter 1264. When the function mechanism is activated, the data mask and probe controller 1260 obtains the QM signal and DQS signal of the QDR device. The QM signal is then converted into a SDR QM signal input to the SDR device, and the DQS signal is converted into a data extraction signal of the QDR-to-SDR device for data extraction. When the QDR command signal is a data read command, the QDR-to-SDR converter 1264 converts the serial signals of the QDR into parallel signals. According to the command of the command controller 122, the parallel signals are transmitted to four SDR devices. When the QDR command signal is a data write command, the SDR-to-QDR data converter 1262 converts the data signals of the four SDR devices into a serial signal used by the QDR device. According to the command of the command controller 122, the converted serial signal is transmitted into the QDR device. According to the rising edge and the descending edge of the operation clock, the serial-parallel converter used here completes the conversion from a serial signal to four parallel signals or from four parallel signals to one serial signal.

Since QDR outputs four bits in one cycle, but SDR only outputs one bit in one cycle, the process speed and efficiency of QDR is superior to that of SDR. In the above embodiment, one QDR device is used to correspond with four SDR devices to design the SDR and QDR converter. It is known to people of ordinary skill in the art that other combinations of the SDR devices and QDR devices can also be applied. However, to maintain the same efficiency, the frequency of the SDR has to be doubled to output the same number of bits as the QDR. Doubling the frequency of SDR causes an increase in fabrication cost, and the fabrication is difficult. Therefore, the invention is focused on using four SDR modules to produce the QDR efficiency.

Figure 1B:
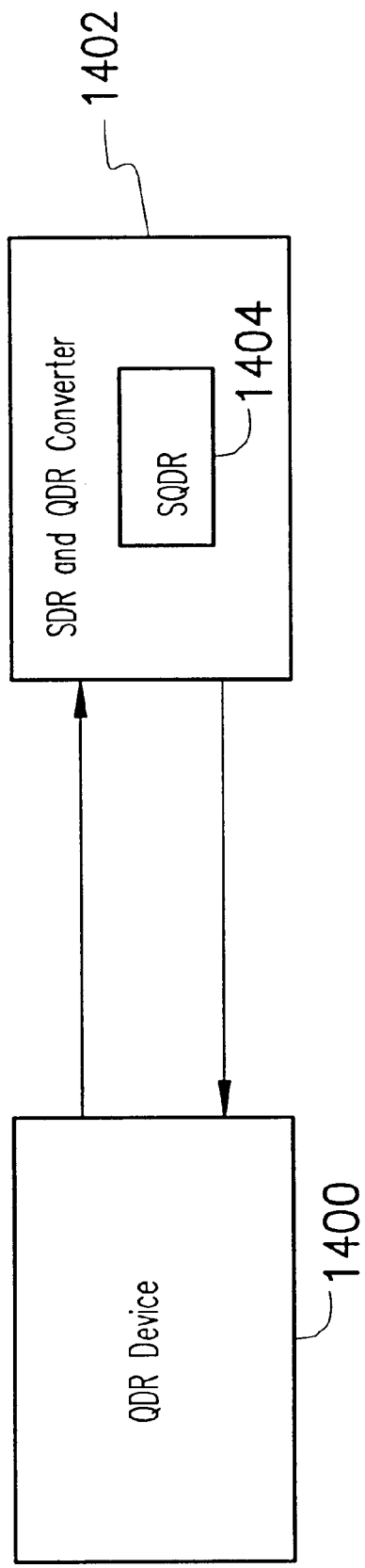
FIG. 1B shows the circuit diagram of the converter as illustrated in FIG. 1A.

In FIG. 1B, the operation circuit of the SDR and QDR converter in FIG. 1A is shown. In a write operation, the DQS signal is input to the SDR and QDR converter 1402 from the QDR device 1400. In a read operation, the DQS signal is input to the SDR and QDR converter 1402 from the QDR device 1400. Being processed by the SQDR 1404 in the SDR and QDR converter 1402, the DQS signal is input to the QDR device. The converter 10 does not require an external phase lock loop and double clock signal, and the DQS signal is directly transmitted. For example, when the QDR device 1400 accesses data on the SDR, the QDR device 1400 outputs an access command. Through the QDR interface 14 to the command controller 122 of the converter 10, the command controller 122 receives the access command by the QDR device and processes the access command into a SDR command. The state data register 124 is ordered to store the data of the mode register set and extended mode register set used by the QDR interface 14, and the function control mechanism is activated. When the function control mechanism is activated, the data mask and probe controller 1260 reads the DM and DQS signals of the QDR device 1400. The data mask probe controller 1260 then converts the DM signal of the QDR device into a SDR DM signal. The DQS signal of the QDR devise 1400 is converted into a data extraction signal of QDR-to-SDR device for data extraction. When the access command of the QDR device 1400 is a data write command, the QDR-to-SDR data converter 1264 converts a serial signal of the QDR device 1400 into four parallel signals transmitted to four SDR devices. When the access command of the QDR device 1400 is a data read command, the SDR-to-QDR data converter 1262 converts the data signal of the four SDR devices into a serial signal used by the QDR device 1400. The serial signal is then transmitted to the QDR device 1400 according to the command of the command controller 122.

Figure 2A:
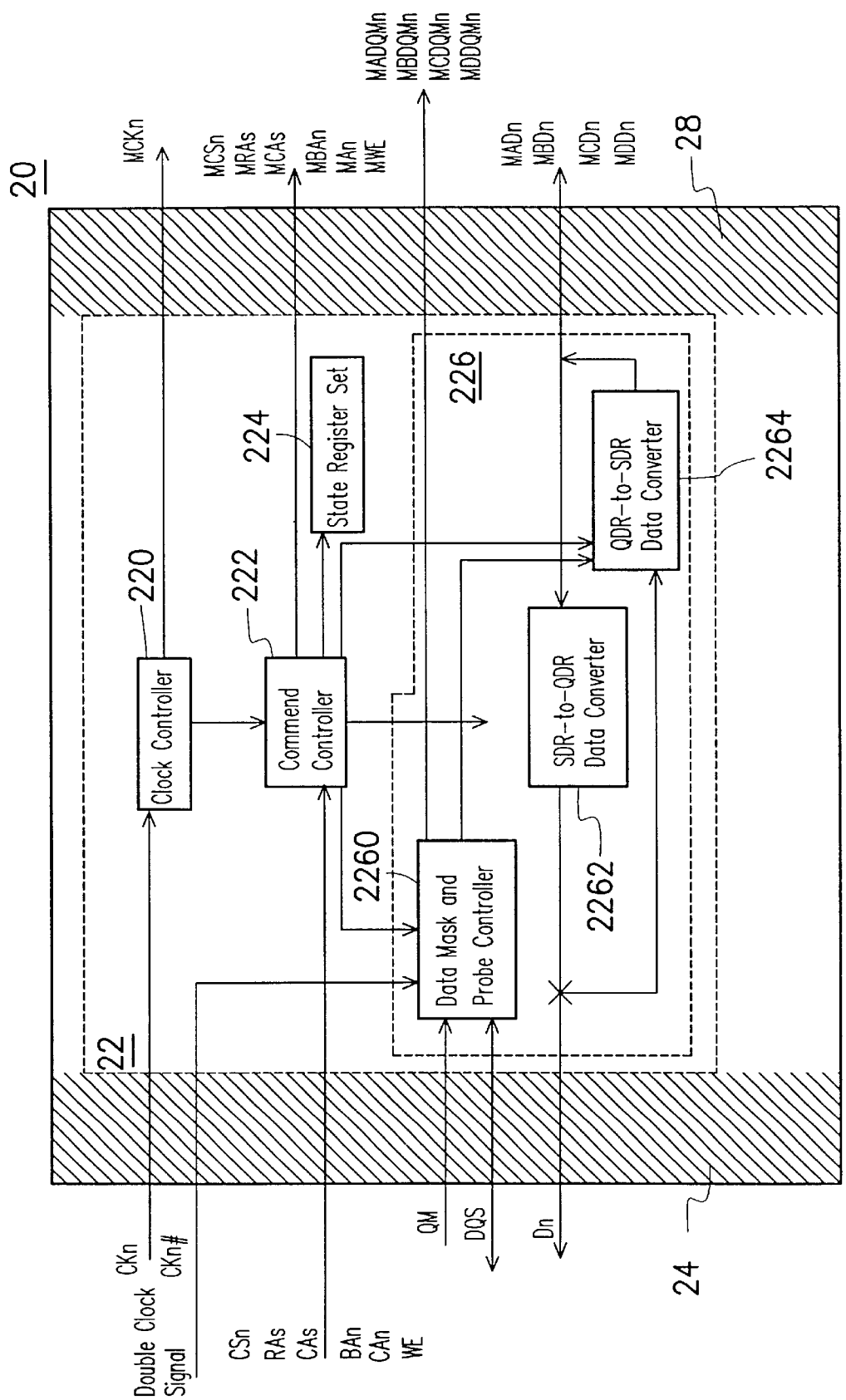
FIG. 2A is a block diagram showing a converter in a second embodiment of the invention.

In FIG. 2A, the block diagram of the converter in the second embodiment of the invention is shown. The apparatus and function are similar to those of FIG. 1A The only difference is the QM signal and the DQS signal obtained by the data mask and probe controller 2260. The QM signal is converted into a data extraction signal used by the QDR-to-SDR device for data extraction. While returning the DQS signal to the QDR device, the return DQS signal is generated according to two times of the clock signal.

Figure 2B:
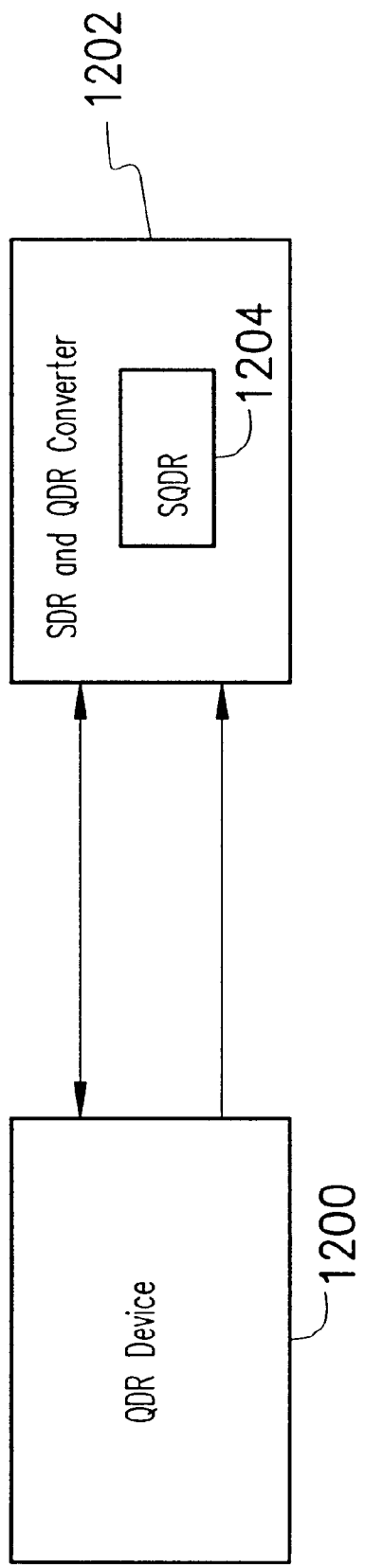
FIG. 2B shows the circuit diagram of the converter as illustrated in FIG. 2A.

In FIG. 2B, an embodiment of the operation circuit for the converter as shown in FIG. 2A is shown. If the return DQS signal is generated according to the double clock signal, the QDR device 1200 inputs the DQS signal to the SDR-to-QDR converter 1204 for a write operation. In a read operation, the SQDR 1204 of the SDR and QDR converter 1202 converts the double clock signal provided by the QDR device 1200 into a DQS signal, output to the QDR device 1200.

Figure 3A:
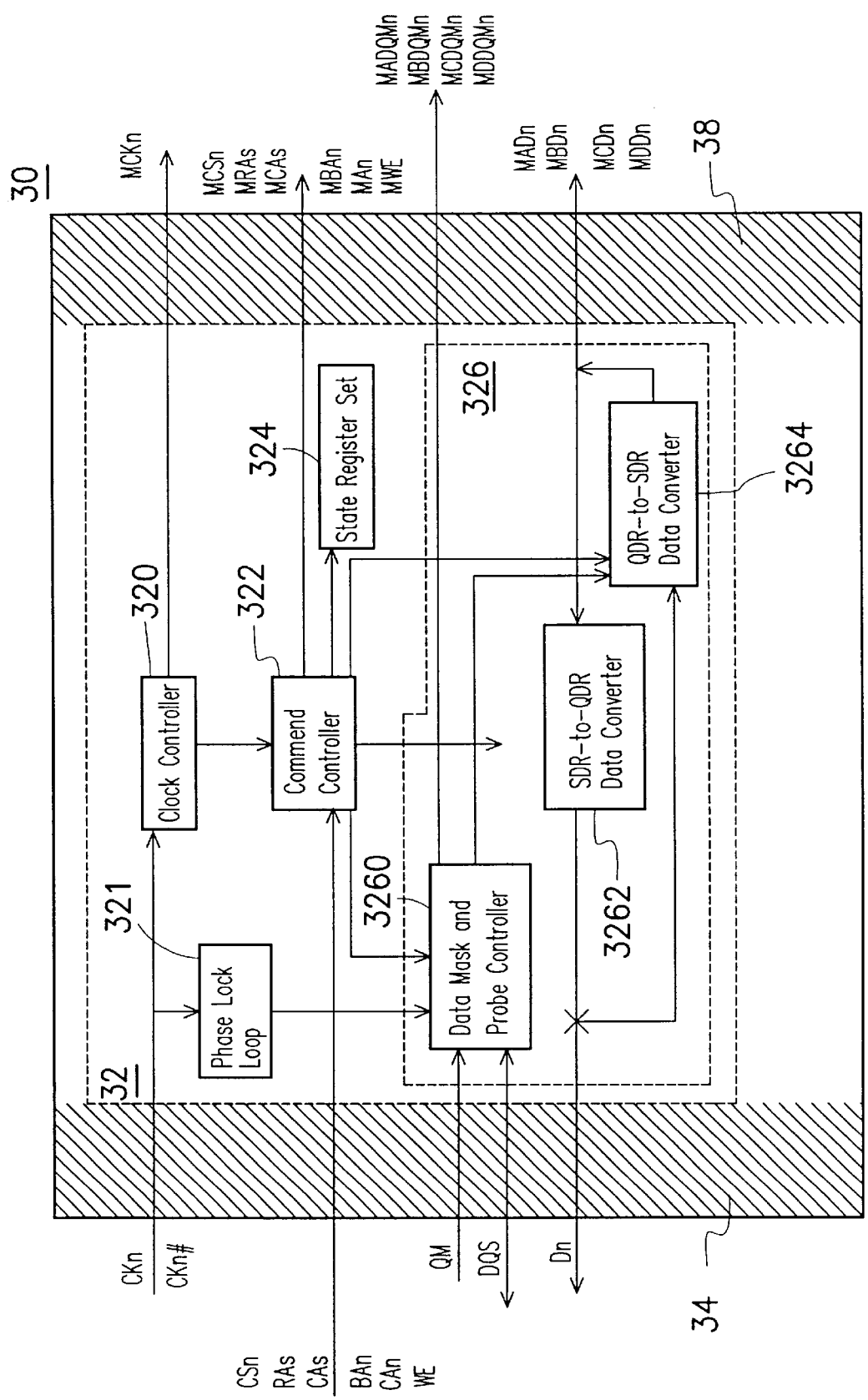
FIG. 3A is a block diagram showing a converter in a third embodiment of the invention.

In FIG. 3A, the third embodiment of the converter is shown. The apparatus and function are similar to those of FIG. 1A. The only difference is the phase lock loop (PLL) 321 and data mask and probe controller 3260. After receiving a clock signal by the phase lock loop 321, an internal operation clock signal with double frequencies of the clock signal is generated. The data mask and probe controller 3260 obtains the QM signal and the DQS signal obtained by the QDR device. The QM signal is converted into a SDR QM signal output to the SDR device. The DQS signal is converted into a data extraction signal for the QDR device to extract data from the SDR device. Then it is necessary to return the DQS signal to the QDR device, and the return DQS signal is generated according to the internal operation clock signal.

Figure 3B:
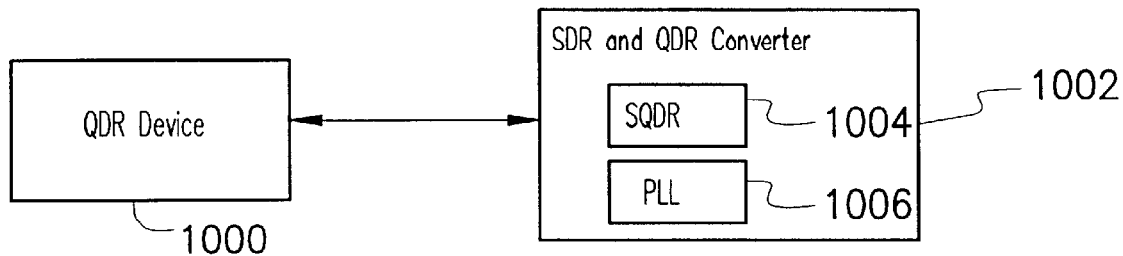
FIG. 3B shows the circuit diagram of the converter as illustrated in FIG. 3A.
Figure 3C:
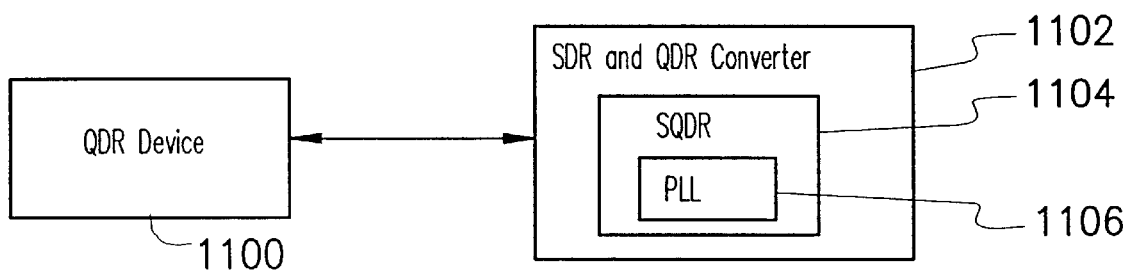
FIG. 3C shows the circuit diagram of the converter as shown in FIG. 3A.
Figure 3D:
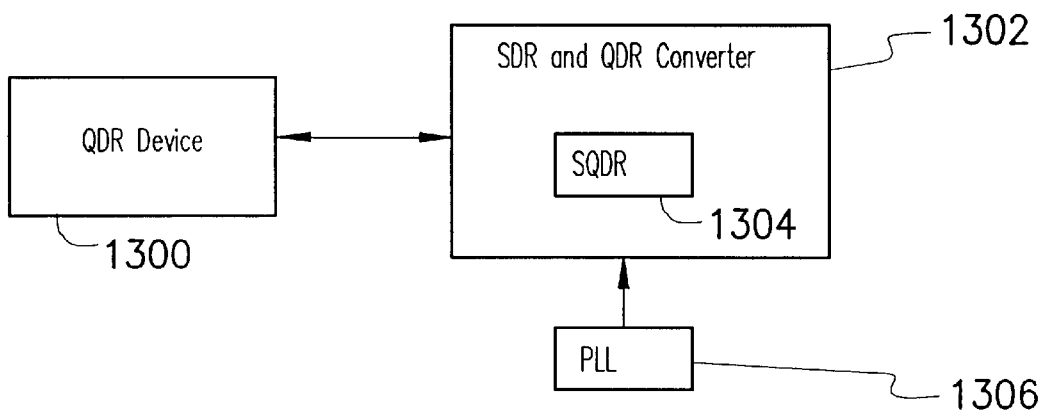
FIG. 3D shows another circuit diagram of the converter as illustrated in FIG. 3A.

Referring to FIG. 3B and FIG. 3D, an operation circuit of the converter as shown in FIG. 2A is shown. The direction from the QDR device to the SDR and QDR converter 1002 is for writing, and the direction from the SDR and QDR converter 1002 to the QDR device 1000 is for reading. In FIGS. 3B and 3D, the phase lock loop 321 can be built in the SDR and QDR converter 1002, or in the SQDR 1004, or even provided externally.

If the phase lock loop 1006 is built in the SDR and QDR converter 1002, and a double clock signal is generated and output to the data converter, the QDR device 1000 outputs the DQS signal to the DQS and QDR converter 1002 for a write operation. For the read operation, the SQDR 1004 of the SDR and QDR converter 1002 converts the internal operation clock signal provided by the programmable array 1006 into a DQS signal output to the QDR device 1000.

In another embodiment, the phase lock loop 1106 is formed inside of the SQDR 1104. FIG. 3C shows the operation circuit of the converter 30 as shown in FIG. 3A. The internal operation clock generated by the phase lock loop 1106 is output to the data converter. In a write operation, the QDR device 1100 inputs the DQS signal to the SDR and QDR converter 1102. In a read operation, The SQDR 1104 of the SDR and QDR converter 1102 converts the internal operation clock signal provided by the programmable logic array 1106 into the DQS signal output to the QDR device.

In yet another embodiment, the phase lock loop 1306 is provided by an external circuit. FIG. 3D shows such operation circuit of the converter 20 as shown in FIG. 2A. The internal operation clock signal generated by the phase lock loop 1306 is input to the SDR and QDR converter 1302. For a write operation, the QDR device 1300 inputs the DQS signal to the SDR and QDR converter 1302. In a read operation, the DQDR 1304 of the SDR and QDR converter 1302 converts the internal operation clock signal provided by the phase lock loop 1306 into the DQS signal output to the QDR device.

Figure 4:
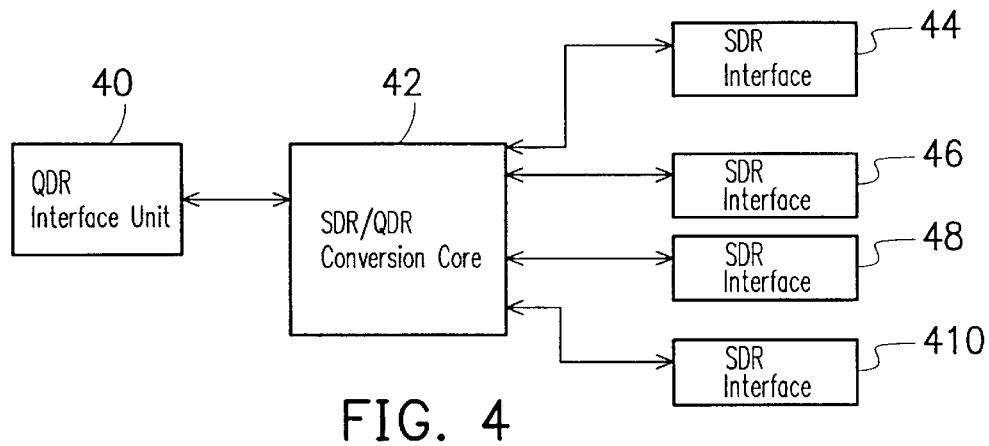
FIG. 4 is a block diagram showing a converter in the fourth embodiment of the invention.

In FIG. 4, a fourth embodiment of the invention is shown. The conversion core is used to convert the QDR command and data format into the SDR command and data format input to the SDR device via the SDR interface 44, 46, 48 and 410. The SDR command and data format is also transferred into the QDR command and data format output to the QDR device via the QDR interface 40.

Figure 5:
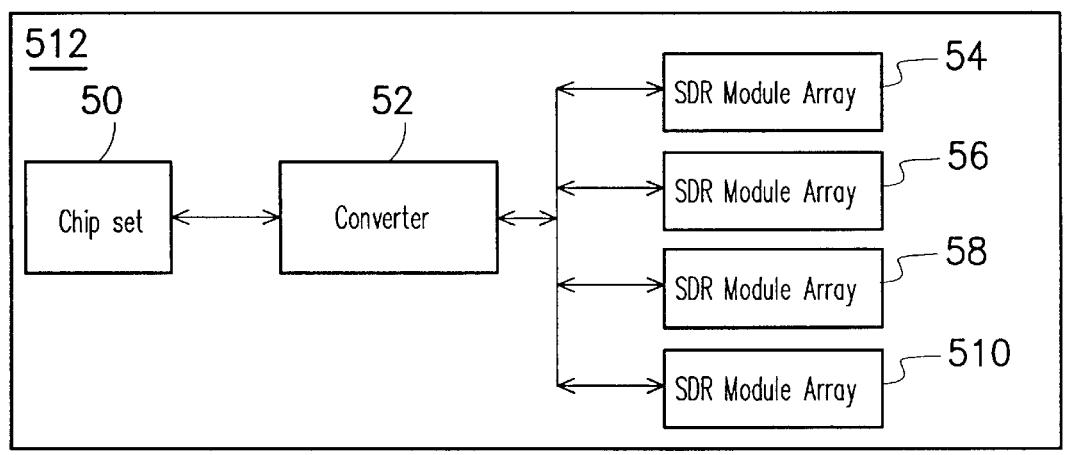
FIG. 5 is a block diagram of the fifth embodiment of the invention.

In FIG. 5, a fifth embodiment of the invention is shown. An interface card 512 includes a chip set 50 that supports the QDR module, a converter 52 and four SDR module arrays 54, 56, 58 and 510. To easily comprehend the block diagram, the QDR and SDR interfaces of the converter 52 are illustrated by the connection lines between the chip set 50 and the SDR module arrays 54,56,58 and 510. The above connection method enables the interface card 512 that supports the QDR module to use the SDR module array.

Figure 6:
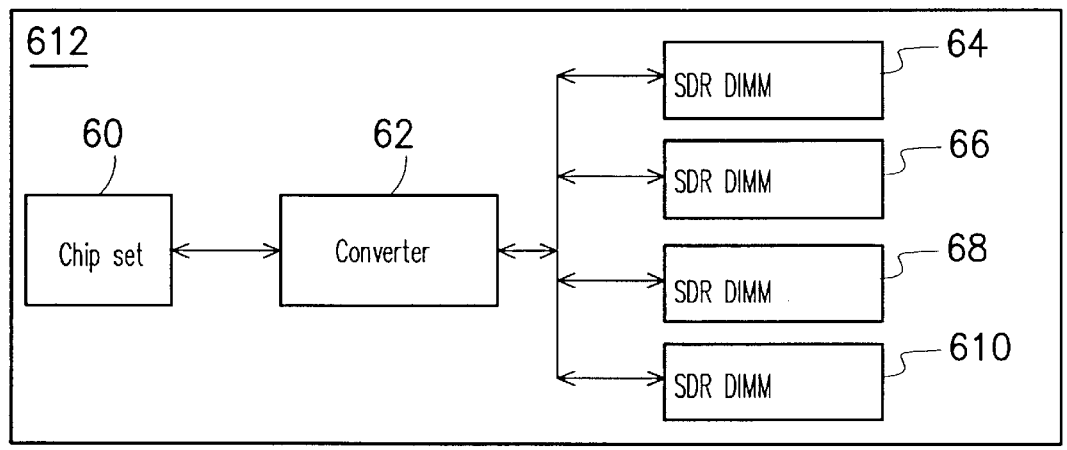
FIG. 6 is a block diagram of the sixth embodiment of the invention.

FIG. 6 shows the sixth embodiment of the invention. The motherboard 612 comprises a chip set 60 that supports the QDR module, a converter 62 and four SDR DIMM's 64, 66, 68 and 610. To easily comprehend the block diagram, the QDR and SDR interfaces of the converter 62 are illustrated by the connection lines between the chip set 60 and the SDR DIMM's 64, 66, 68 and 610. The above connection method enables the motherboard 612 that supports the QDR DIMM to use the SDR module array.

Figure 7:
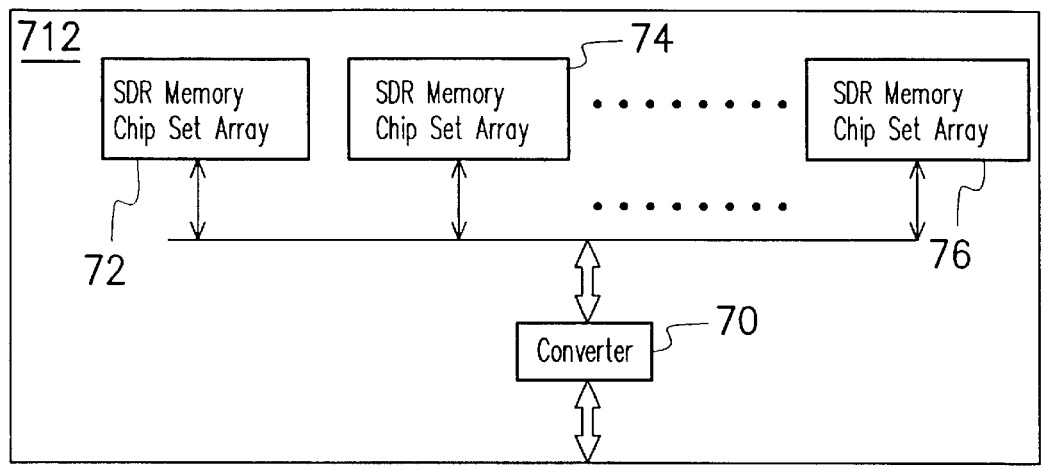
FIG. 7 is a block diagram of the seventh embodiment of the invention.

FIG. 7 shows the seventh embodiment of the invention. The memory module set 712 comprises a converter 70 and several SDR memory chip set arrays 72–76. To easily comprehend the block diagram, the QDR and SDR interfaces of the converter 72 are illustrated by the connection lines between the external devices and the SDR memory chip set arrays 72–76. The above connection method enables the memory module set 712 that supports the QDR memory chip set array to use the SDR module array.

Figure 8:
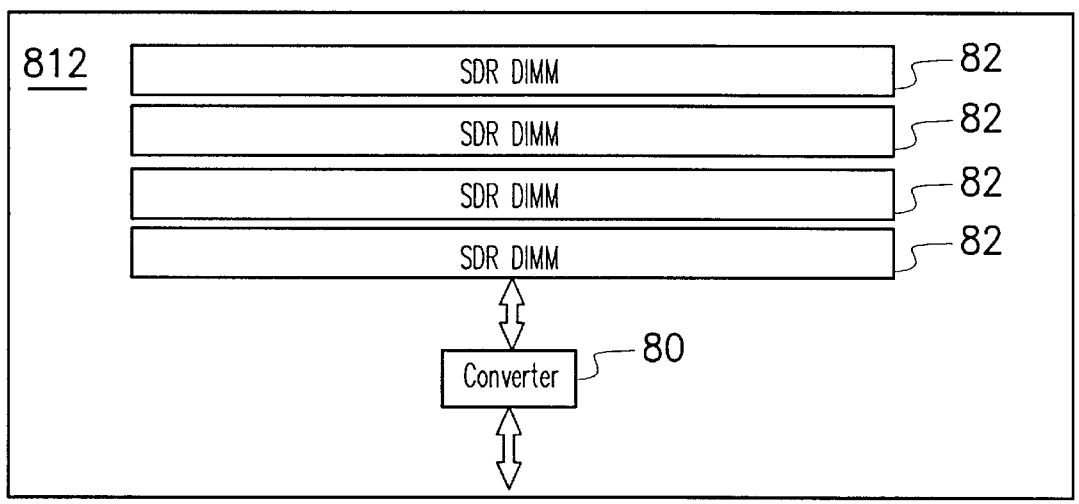
FIG. 8 is a block diagram of the eighth embodiment of the invention.

FIG. 8 shows the block diagram of the eighth embodiment of the invention. The memory module interface 812 comprises a converter 80 and four SDR DIMM's 82, 84, 86, 88. For convenience, the QDR interface and SDR interface of the converter 80 are indicated as the connecting lines between the external apparatus and the SDR DIMM's 82m, 84, 86, 88. Such a connection method can apply the SDR DIMM to the memory module interface 812 that supports the QDR DIMM.

Figure 9:
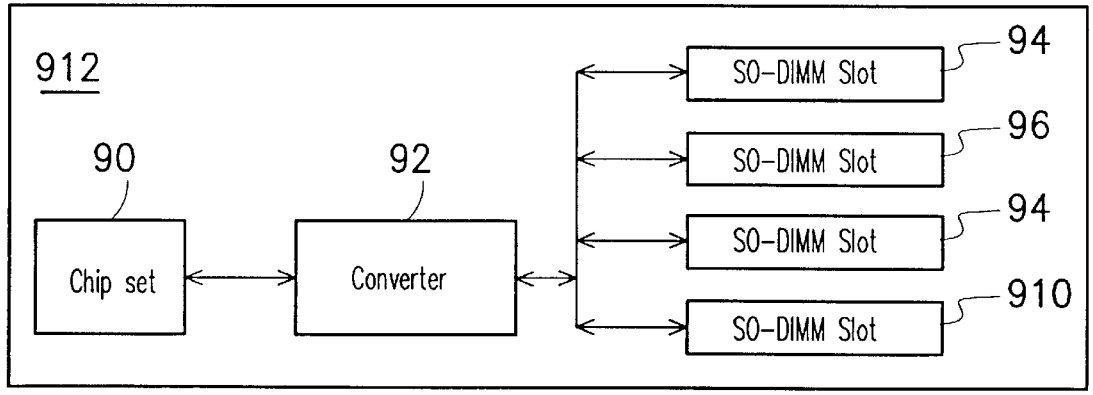
FIG. 9 is a block diagram of the ninth embodiment of the invention.

FIG. 9 shows the ninth embodiment of the invention. The portable computer motherboard 912 comprises a chip set 90 that supports the QDR module, a converter 92 and four SDR DIMM's 94, 96, 98 and 910. To easily comprehend the block diagram, the QDR and SDR interfaces of the converter 92 are illustrated by the connection lines between the chip set 90 and the SDR DIMM's 94, 96, 98 and 910. The above connection method enables the portable computer motherboard 912 that supports the QDR DIMM to use the SDR module array.

According to the above, the invention performs the normal operations of the QDR and SDR simultaneously by building up the conversion channel between QDR and SDR. Furthermore, when only the SDR memory is in use, a data process efficiency of QDR can be obtained.

The user does not have to purchase a new QDR memory module to obtain the QDR effect with the existent SDR memory module. One can also use the SDR memory module with the QDR memory module simultaneously to further enhance the system performance.

To the manufacturers, while fabricating the memory module and interface card, an SDR chip with a cheaper cost can be selected. With the apparatus provided by the invention, one can have the QDR process quality and effect of QDR with the existent SDR products. The invention also enables the user to achieve the QDR efficiency under the circumstances of using either the SDR or QDR module.

It is to be further understood that various additions, deletions, modifications and alterations may be made to the above-described embodiments without departing from the intended spirit and scope of the present invention. Accordingly, it is intended that all such additions, deletions, modifications and alterations be included within the scope of the following claims.

What is claimed is:

1. A SDR and QDR converter, comprising:
   a QDR interface, to perform a signal exchange with a QDR device;
   a SDR interface, to perform a signal exchange with a SDR device;
   a clock controller, to convert a clock signal output from the QDR device into an operation clock signal used by the SDR and QDR converter and the SDR device;
   a state register set, to store a QDR device state;
   a command controller, to obtain and process a QDR command signal into a corresponding SDR command signal output to the SDR device; and
   a data converter, coupled to the command controller, the QDR interface and the SDR interface, to receive a command sent by the command controller, and to convert a QDR data format into an appropriate SDR data format, and to convert a SDR data format into an appropriate QDR data format.

2. The SDR and QDR converter of claim 1, wherein the data converter comprises:
- a data mask and probe controller, to obtain a QM signal and a DQS signal of the QDR device, and to convert the QM signal into a SDR QM signal input to the SDR device, and to convert the DQS signal into a data extraction signal for the QDR device to extract data from the SDR device;
- a QDR-to-SDR data converter, to convert a serial signal of the QDR device into parallel signals, and to transmit the parallel signals into four SDR devices individually according to the command of the command controller; and
- a SDR-to-QDR data converter, to convert data signals of the four SDR devices into a serial signal used by the QDR device, and to transmit the serial signal into the QDR device according to the command of the command controller.

3. The SDR and QDR converter of claim 1, wherein the data converter further comprises:
- a data mask and probe controller, to obtain a QM signal and a DQS signal of the QDR device, and to convert the QM signal into a SDR QM signal output to the SDR device, to convert the DQS signal into a data extraction signal for the QDR device to extract data from the SDR device, and to return the DQS signal according to two times of the clock signal when the DQS signal has to be retransmitted back to the QDR device;
- a QDR-to-SDR data converter, to convert a serial signal of the QDR device into parallel signals, and to transmit the parallel signals into four SDR devices individually according to a command of the command controller; and
- a SDR-to-QDR data converter, to convert data signals of the four SDR devices into a serial signal used by the QDR device, and to transmit the serial signal into the QDR device according to the command of the command controller.

4. The SDR and QDR data converter of claim 1, wherein the data converter comprises:
- a phase lock loop, to receive the clock signal and to generate an internal operation clock signal with a frequency double a frequency of the clock signal;
- a data mask and probe controller, to obtain a QM signal and a DQS signal of the QDR device, and to convert the QM signal into a SDR QM signal output to the SDR device, and to convert the DQS signal into a data extraction signal for the QDR device to extract data from the SDR device and to return the DQS signal according to the internal operation clock signal when the DQS signal has to be retransmitted back to the QDR device;
- a QDR-to-SDR data converter, to convert a serial signal of the QDR device into parallel signals, and to transmit the parallel signals into four SDR devices individually according to a command of the command controller; and
- a SDR-to-QDR data converter, to convert data signals of the SDR devices into a serial signal used by the QDR device, and to transnit the serial signal into the QDR device according to the command of the command controller.

5. A SDR and QDR converter, comprising:
- a QDR interface, to perform a signal exchange with a QDR device;
- a SDR interface, to perform a signal exchange with a SDR device;
- a conversion core, to convert a QDR command and data format into a SDR command and data format sent to the SDR device via the SDR interface, and to convert a SDR command and data format sent to the QDR device via the QDR interface.

6. An interface card using a SDR and QDR converter, applied to a circuit board supporting a QDR module, the circuit comprising at least a chip set that supports the QDR module, the interface card comprising:
- at least a SDR module array; and
- a SDR and QDR converter, comprising:
  - a QDR interface, to perform a signal exchange with the chip set;
  - a SDR interface, to perform a signal exchange with the SDR module array; and
  - a conversion core, to convert a QDR command and data format into a SDR command and data format output to the SDR module array via the SDR interface, and to convert a SDR command and data format into a QDR command and data format output to the chip set that support the QDR module via the QDR interface.

7. A motherboard using a SDR and QDR converter, comprising:
- a chip set, to support a QDR module; and
- a SDR and QDR converter, further comprising:
  - at least a SDR DIMM;
  - a SDR and QDR converter, having a QDR interface to perform a signal exchange with the chip set, a SDR interface, to perform a signal exchange with the SDR DIMM, and a conversion core, to convert a QDR command and data format into a SDR command and data format output to the SDR DIMM via the SDR interface, and to convert a SDR command and data format into a QDR command and data format output to the chip set that support the QDR module via the QDR interface.

8. A memory module using a SDR and QDR converter, applied to a memory that support a QDR memory module, the memory module comprising:
- at least a SDR memory chip set array; and
- a SDR and QDR converter, having a QDR interface to perform a signal exchange with the memory, a SDR interface, to perform a signal exchange with the SDR memory chip set array, and a conversion core, to convert a QDR command and data format into a SDR command and data format output to the SDR memory chip set array via the SDR interface, and to convert a SDR command and data format into a QDR command and data format output to the memory.

9. A memory module interface using a SDR and QDR converter, comprising:
- at least a SDR DIMM; and
- a SDR and QDR converter, having a QDR interface to perform a signal exchange with the memory module interface, a SDR interface, to perform a signal exchange with the SDR DIMM, and a conversion core, to convert a QDR command and data format into a SDR command and data format output to the DDR DIMM via the SDR interface, and to convert a SDR command and data format into a QDR command and data format output to the memory module interface.

10. A portable computer motherboard using a SDR and QDR converter, comprising:

a chip set that support a QDR module; and a SDR and QDR converter, having a QDR interface to perform a signal exchange with the chip set, a SDR interface providing at least a SO-DIMM slot, and a conversion core, to convert a QDR command and data format into a SDR command and data format output to the SO-DIMM slot via the SDR interface, and to convert a SDR command and data format into a QDR command and data format output to the chip set via the QDR interface.

* * * * *